United States Patent
Dumoulin et al.

(10) Patent No.: US 6,914,432 B2
(45) Date of Patent: Jul. 5, 2005

(54) PHASED ARRAY COIL ASSEMBLY AND METHOD AND SYSTEM FOR EMPLOYING THE SAME

(75) Inventors: Charles Dumoulin, Ballston Lake, NY (US); Ronald Watkins, Niskayuna, NY (US); Randy Giaquinto, Burnt Hills, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/601,352

(22) Filed: Jun. 23, 2003

(65) Prior Publication Data

US 2004/0257079 A1 Dec. 23, 2004

(51) Int. Cl.[7] ................................................. G01V 3/00
(52) U.S. Cl. ......................................... 324/318; 324/319
(58) Field of Search ............................... 324/318, 319, 324/309, 307, 322; 600/422

(56) References Cited

U.S. PATENT DOCUMENTS

| | | | | |
|---|---|---|---|---|
| 5,370,118 A | * | 12/1994 | Vij et al. ..................... | 600/422 |
| 5,389,880 A | * | 2/1995 | Mori ........................... | 324/318 |
| 5,430,378 A | * | 7/1995 | Jones .......................... | 324/318 |
| 5,548,218 A | * | 8/1996 | Lu .............................. | 324/318 |
| 5,969,525 A | | 10/1999 | Van Driel et al. .......... | 324/318 |
| 6,040,697 A | | 3/2000 | Misic et al. ................ | 324/318 |
| 6,150,816 A | * | 11/2000 | Srinivasan .................. | 324/318 |
| 6,323,648 B1 | * | 11/2001 | Belt et al. ................... | 324/322 |
| 6,493,572 B1 | * | 12/2002 | Su et al. ..................... | 600/422 |
| 6,534,983 B1 | * | 3/2003 | Boskamp et al. ........... | 324/318 |
| 6,538,442 B2 | | 3/2003 | Boskamp et al. ........... | 324/318 |

* cited by examiner

Primary Examiner—Brij Shrivastav
(74) Attorney, Agent, or Firm—Fletcher Yoder

(57) ABSTRACT

A magnetic resonance imaging system comprises a phased array coil assembly and a signal processing circuit. The phased array coil assembly includes a plurality of coils coextensively covering a predetermined area. Each of the plurality of coils comprises a different number of loops over the predetermined area and divides the predetermined area into at least three contiguous regions arranged linearly along the predetermined area. The signal processing circuit is coupled to the phased array coil assembly for receiving a plurality of magnetic resonance signals detected by the plurality of coils. The signal processing circuit is configured to localize the plurality of magnetic resonance signals originating in at least one of the contiguous regions.

53 Claims, 4 Drawing Sheets

PHASED ARRAY COIL ASSEMBLY AND METHOD AND SYSTEM FOR EMPLOYING THE SAME

BACKGROUND OF THE INVENTION

The invention relates generally to a phased array coil assembly and more specifically to a phased array coil assembly for use in Magnetic Resonance Imaging (MRI).

Magnetic resonance imaging systems have found increasing applicability for a variety of imaging tasks, particularly in the medical field. Such systems also typically include coil assemblies for generating radio frequency (rf) magnetic fields used to control and excite spin systems in a subject of interest, such as in soft tissues of a patient. A body coil is typically employed for generating a highly uniform rf magnetic field transverse to the direction of the main, magnetic field direction. A series of gradient coils generate spatially varying magnetic fields to select a portion of the subject to be imaged, and to spatially encode sensed signals emitted by unitary volumes within the selected slice. The field gradients may be manipulated to orient the selected image slice, and to perform other useful imaging functions. Signals of a particular frequency acquired during application of the field gradient may be assumed to originate at a given position within the field gradient. The application of such a field gradient is also referred to as frequency encoding.

Sensing coils are employed in conventional MRI systems and are adapted to the particular type of image to be acquired. Such sensing coils are highly sensitive to emissions from the subject positioned within the primary and gradient fields. Such emissions, collected during data acquisition phases of imaging, serve to generate raw data signals which may be processed to extract information relating to the nature and location of different tissue types in the subject. Where the region to be imaged is relatively small, a single channel surface coil may be employed. For example, a linearly polarized shoulder coil is typically employed for producing images of a human shoulder. For larger images, large single coils may be employed, or multiple coils may be used, such as in "phased array" arrangements. However, the use of large surface coils tends to result in lower signal-to-noise ratios in the acquired image data. Generally, surface coils have limited field of view (FOV) and lead to inhomogenous spatial uniformity. Phased array coils overcome this problem. Phased array coil assemblies are, therefore, commonly employed to produce images of larger areas, while providing an acceptable signal-to-noise ratio. Typically, phased array coil assemblies consist of multiple, non interacting coils, having similar SNR as a surface coil, but the combined FOV of a larger coil. In addition, the penetration of array coils compensates for limited penetration of individual coils.

In a typical phased array arrangement, several adjacent coils are provided for receiving the signals emitted by the spin systems of interest during the signal acquisition phase of imaging. The output signals from each of several adjacent coils are independently amplified in the preamplifiers prior to processing of the signals for generation of the image data.

Use of phased array coils also impacts the formation of magnetic resonance (MR) images (either two dimensional i.e 2D or three dimensional i.e 3D) which takes place in the complex Fourier domain, called k-space. In a typical MR system, as described above, gradients of varied strength are applied in a perpendicular direction to the frequency encoding gradient using gradient coils, prior to acquisition of the signal, to thereby twist the phase of the nuclear spins by varied amounts. The application of such additional gradients is referred to as phase encoding. Frequency-encoded data sensed by the detector coils after a phase encoding step is stored as a line of data in the k-space matrix. Multiple phase encoding steps are performed in order to fill the multiple lines of the k-space matrix. An image may be generated from this matrix by performing a two-dimensional or three dimensional Fourier transformation of the matrix to convert this frequency information to spatial information representing the distribution of nuclear spins or density of nuclei of the image material. One of the time limiting factor in the formation of MR images is the process of filing up k-space with data, which is done in successive manner, one line at a time.

To overcome these inherent limits, several techniques have been developed to effectively simultaneously acquire multiple lines of data for each application of a magnetic field gradient. These techniques, which may collectively be characterized as "parallel imaging techniques", use spatial information from the radio frequency (rf) detector coils to substitute for the encoding which would otherwise have to be obtained in a sequential fashion using field gradients alone. The use of multiple rf detector coils has been shown to decrease image acquisition time. Several coil geometries have been attempted for use with these parallel imaging techniques for enhancing image acquisition time. Typically these include linear arrays of coils and spatial information is acquired from minimally overlapping coils. Multiplexed array having a circular symmetry having three component coils have also been suggested. These arrangements have limitations in terms of using complex computations or implementation limitations when larger number of coils are desired.

It is therefore desirable to have coil geometries which significantly reduce the computation load and lead to easy implementation in MRI systems.

BRIEF DESCRIPTION OF THE INVENTION

Briefly, in accordance with one aspect of the invention, a magnetic resonance (MR) system comprises a phased array coil assembly and a signal processing circuit. The phased array coil assembly comprises a plurality of coils which coextensively cover a predetermined area. Each of the plurality of coils comprises a different number of loops over the predetermined area and divides the predetermined area into at least three contiguous regions arranged linearly along the predetermined area. The signal processing circuit is coupled to the phased array coil assembly and receives a plurality of magnetic resonance signals detected by the plurality of coils of the phased array assembly. The signal processing circuit is configured to localize the plurality of magnetic resonance signals originating in at least one of the contiguous regions. In an alternate aspect, a method of using a phased array coil assembly in presence of a gradient field system comprises receiving a plurality of magnetic resonance signals using a plurality of coils of the phased array coil assembly and processing the magnetic resonance signals detected by the phased array coil assembly. These plurality of coils coextensively cover a predetermined area. Each of the plurality of coils comprises a different number of loops over the predetermined area and divides the predetermined area into at least three contiguous regions arranged linearly along the predetermined area.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF SPECIFIC EMBODIMENTS

Figure 1:
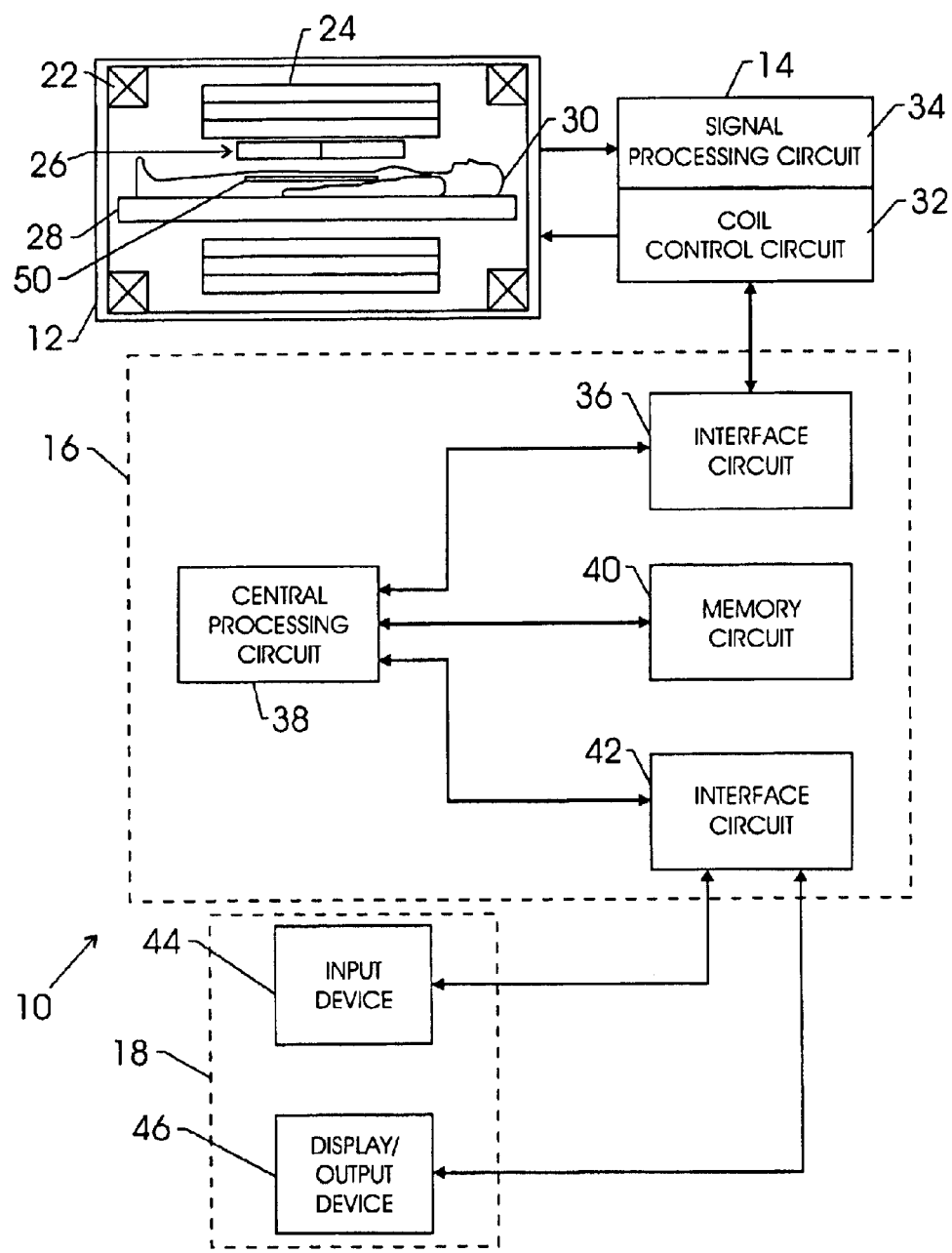
FIG. 1 is a schematic block diagram of an exemplary magnetic resonance (MR) imaging system suitable for use with the present invention embodiments.

Referring now to FIG. 1, a magnetic resonance imaging system, designated generally by the reference numeral 10, is illustrated as including a magnet assembly 12, control and acquisition circuit 14, system controller circuit 16, and an operator interface station 18. The magnet assembly 12, in turn, includes coil assemblies for selectively generating controlled magnetic fields used to excite gyromagnetic materials spin systems in a subject of interest. In particular, the magnet assembly 12 includes a primary coil 22, which will typically include a super conducting magnet coupled to a cryogenic refrigeration system (not shown). The primary coil 22 generates a highly uniform magnetic field along a longitudinal axis of the magnet assembly. A transmit coil assembly 24 consisting of a series of gradient coils and a transmit RF coil is provided for generating controllable gradient magnetic fields having desired orientations with respect to the subject 30, and particularly with respect to the region of interest which is illustrated as predetermined area 50. In particular, as will be appreciated by those skilled in the art, the transmit coil assembly 24 produces fields in response to pulsed signals for selecting an image slice, orienting the image slice, and encoding excited gyromagnetic material spin systems within the slice to produce the desired image. A receiving coil assembly, which is a phased array coil assembly 26, according to one aspect of the invention, is provided for detecting emissions from gyromagnetic material spin systems within the predetermined area 50, during data acquisition phases of operation of the system and is elaborated further in description below. A table 28 is positioned within the magnet assembly 12 to support a subject 30.

In the embodiment illustrated in FIG. 1, the control and acquisition circuit 14 includes coil control circuit 32 and signal processing circuit 34. The coil control circuit 32 receives pulse sequence descriptions from the system controller 16, notably through the interface circuit 36 included in the system controller 16. As will be appreciated by those skilled in the art, such pulse sequence descriptions generally include digitized data defining pulses for exciting the coils the transmit coil assembly 24 during excitation and data acquisition phases of imaging. Fields generated by the coils transmit coil assembly 24 excite the spin system within the subject 30 to cause emissions from the material, particularly the region of interest or a predetermined area 50 within the subject 30. Such emissions from the predetermined area 50 are detected by a receiving coil assembly 26 and are filtered, amplified, and transmitted to signal processing circuit 34. Signal processing circuit 34 may perform preliminary processing of the detected signals also described in detail below, and further perform amplification of the signals. Following such processing, the amplified signals are transmitted to the interface circuit 36 for further processing.

In addition to the interface circuit 36, the system controller 16 includes central processing circuit 38, memory circuit 40, and interface circuit 42 for communicating with the operator interface station 18. In general, the central processing circuit 38, which will typically include a digital signal processor, a CPU or the like, as well as associated signal processing circuit, commands excitation and data acquisition pulse sequences for the magnet assembly 12 and the control and acquisition circuit 14 through the intermediary of the interface circuit 36. The central processing circuit 38 also processes image data received via the interface circuit 36, to perform 2D Fourier transforms to convert the acquired data from the time domain to the frequency domain, and to reconstruct the data into a meaningful image. The memory circuit 40 serves to save such data, as well as pulse sequence descriptions, configuration parameters, and so forth. The interface circuit 42 permits the system controller 16 to receive and transmit configuration parameters, image protocol and command instructions, and so forth.

The operator interface station 18 includes one or more input devices 44, along with one or more display or output devices 46. In a typical application, the input device 44 will include a conventional operator keyboard, or other operator input devices for selecting image types, image slice orientations, configuration parameters, and so forth. The display/output device 46 will typically include a computer monitor for displaying the operator selections, as well as for viewing scanned and reconstructed images. Such devices may also include printers or other peripherals for reproducing hard copies of the reconstructed images.

The technique described below may be equally well applied to various alternative configurations of magnetic resonance systems and scanners, including smaller scanners, and scanners incorporating single channel, phased array and similar receiving coil structures. Moreover, the signal combining techniques described below may find application outside of the field of magnetic resonance imaging, and outside of the field of medical imaging in general.

Figure 2:
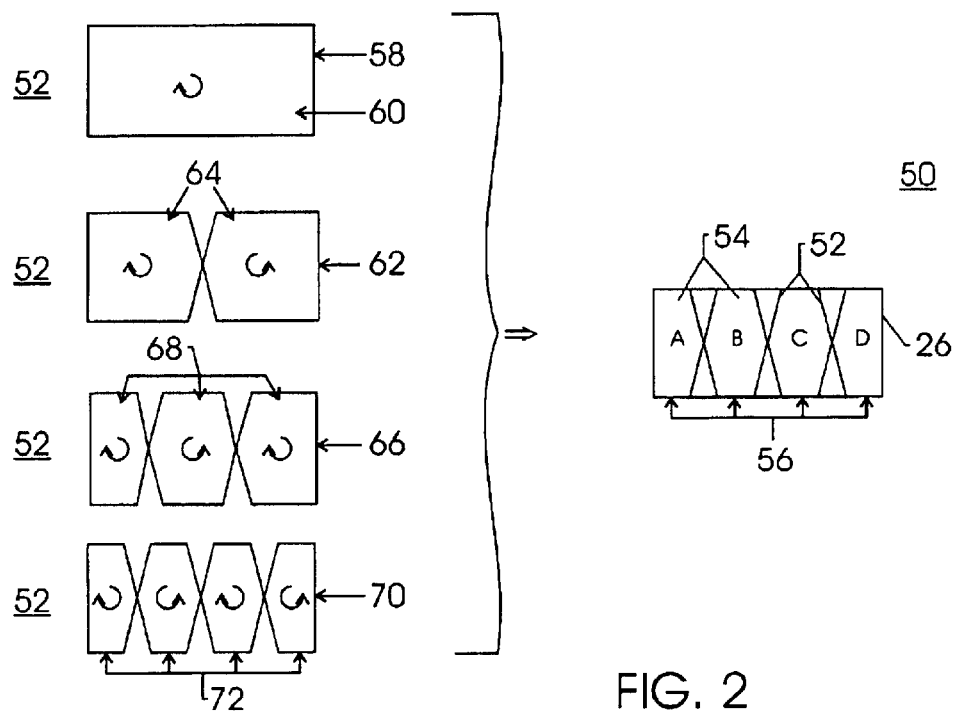
FIG. 2 is a diagrammatic view of a phased array coil assembly for use in the embodiment of FIG. 1 or independently.

A magnetic resonance imaging system 10 of FIG. 1, in one aspect comprises a phased array coil assembly 26 as illustrated on the right side in FIG. 2. The coil assembly 26 includes a plurality of coils 52, which coextensively cover a predetermined area 50, which is the area of interest with the subject 30 as described with reference to FIG. 1. The plurality of coils 52 are configured such that they detect magnetic resonance signals from a same spatial sensitivity volume enclosed with the predetermined area 50. Each of the plurality of coils 52 comprises a different number of loops 54 over the predetermined area 50. Further, the coils 52 divide the predetermined area 50 into at least three contiguous regions 56 arranged linearly along the predetermined area 50. FIG. 2 depicts the predetermined area being divided into four contiguous regions A, B, C, D since in this exemplary embodiment four coils are employed. At least one loop of a respective coil of the plurality of coils 52 is configured to overlap a loop of another respective coil of the plurality of coils 52 to reduce mutual inductance between the plurality of coils 52. In one example, the plurality of coils 52 in the phased array coil assembly 26 comprise at least four coils 52 coextensively covering the predetermined area 50.

In another specific example, the plurality of coils 52, in the phased array coil assembly 26, comprise four coils covering the predetermined area 50 as shown on left side in FIG. 2. These coils include, a first coil 58 forming a single loop 60 extending over the predetermined area 50; a second coil 62 forming two loops 64 over the predetermined area 50; a third coil 66 forming three loops 68 over the predetermined area 50; and a fourth coil 70 forming four loops 72 over the predetermined area 50. As would be appreciated by one skilled in the art, the four coils 58, 62, 66 and 70 overlap, such that the second coil 62 is coextensive with the first coil 58, the third coil 66 is coextensive with the second coil 62 and the fourth coil 70 is coextensive with the third coil 66 and provide the configuration of the coil assembly 26 on the right side of FIG. 2 and described hereinabove. The predetermined area 50, in this example is divided into four contiguous regions 56, represented by A, B, C, D in FIG. 2 and arranged linearly along the predetermined area 50.

Figure 3:
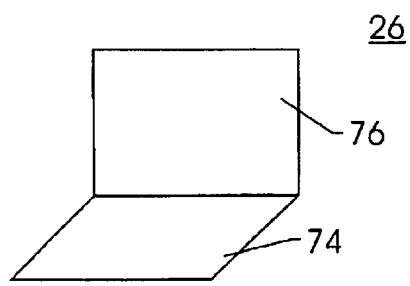
FIG. 3 is a diagrammatic view of one variation of the phased array coil assembly of FIG. 2.
Figure 4:
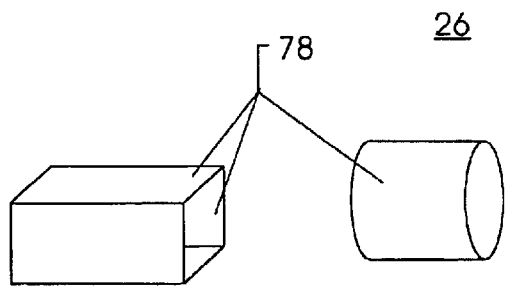
FIG. 4 is a diagrammatic view of another variation of the phased array coil assembly of FIG. 2.

In yet another example as shown in FIG. 3, the phased array coil assembly 26 comprises a first phased array coil assembly 74 and a second generally similar phased array coil assembly 76 disposed orthogonal to the first phased array coil assembly 74. This arrangement is useful for quadrature detection in MRI. These first and second coil assemblies can have several variations. In one example, the first and second phased array coil assemblies are generally planar. In another example, the first and second phased array coil assemblies are generally curvacious. In one specific example as shown in FIG. 4, the phased array coil assembly 26, further comprises a plurality of self similar assemblies 78 disposed to enclose a volume. The coil assemblies in these examples comprise the coil configuration as described hereinabove with reference to FIG. 2.

In the examples of phased array coil assembly described hereinabove, each of the plurality of coils 52 is symmetrical about a horizontal and vertical axis with respect to the axis along which the plurality of coils 52 is arranged.

Further in the examples of phased array coil assembly 26 mentioned hereinabove, each of the plurality of coils 52 has a unique spatial phase sensitivity though the volume of spatial sensitivity covered by each coil is substantially the same (volume covering the predetermined area 50). As would be appreciated by one skilled in the art, the plurality of magnetic resonance signals received from the coil assembly 26 will vary in phase with position of the plurality of coils 52. Referring to FIG. 1, if A, B, C and D are considered as the regions for MR signal sources, each of these regions has a unique combination of phase shifts associated with it with respect to the four coils 58, 62, 66 and 70. If we depict the anticlockwise rotation as + and clockwise as −, we can draw a correlation between the coil rotation (phase) and the region of signal source as follows:

| Coil/Region | A | B | C | D |
|---|---|---|---|---|
| Coil 58 | + | + | + | + |
| Coil 62 | + | + | − | − |
| Coil 66 | + | − | − | + |
| Coil 70 | + | − | + | − |

Thus, combining the magnetic resonance signals appropriately, the signals from each region can be selectively detected:

Region A=Coil 58+Coil 62+Coil 66+Coil 70,
Region B=Coil 58+Coil 62−Coil 66−Coil 70,
Region C=Coil 58−Coil 62−Coil 66+Coil 70 and
Region D=Coil 50−Coil 62+Coil 66−Coil 70.

The combination described hereinabove can be accomplished by using analog hardware before the digitization of signals or can be computed numerically after digitization. These aspects are elaborated in detail hereinbelow. As would be appreciated by one skilled in the art, the phase array coil assembly 26, as described hereinabove may have other applications and uses in fields different from MR imaging.

The imaging system 10 also comprises a signal processing circuit 34 coupled to the phased array coil assembly 26 for receiving a plurality of magnetic resonance signals which are detected by the plurality of coils 52. The signal processing circuit 34 is configured to localize these plurality of magnetic resonance signals originating in at least one of the contiguous regions 56.

Figure 5:
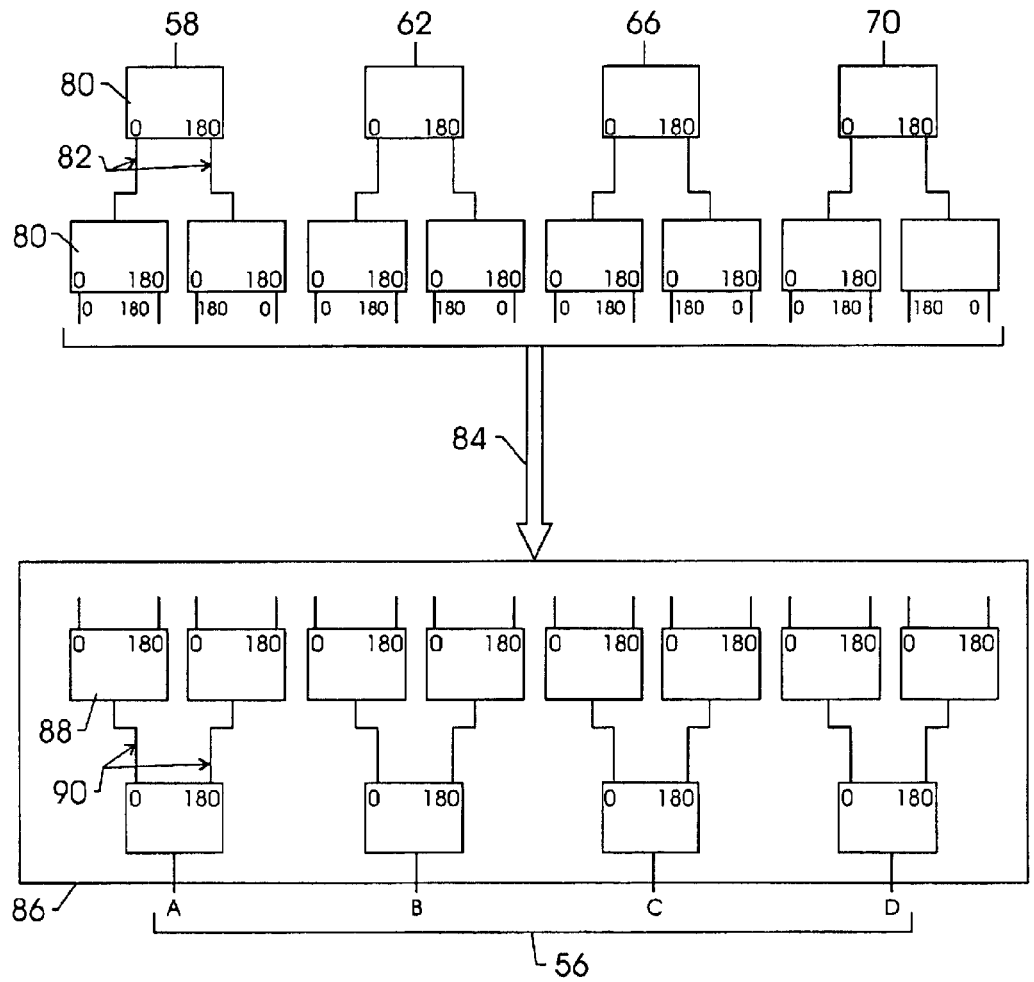
FIG. 5 is a diagrammatic view of one aspect of the signal processing circuit for use in the embodiment of FIG. 1.
Figure 6:
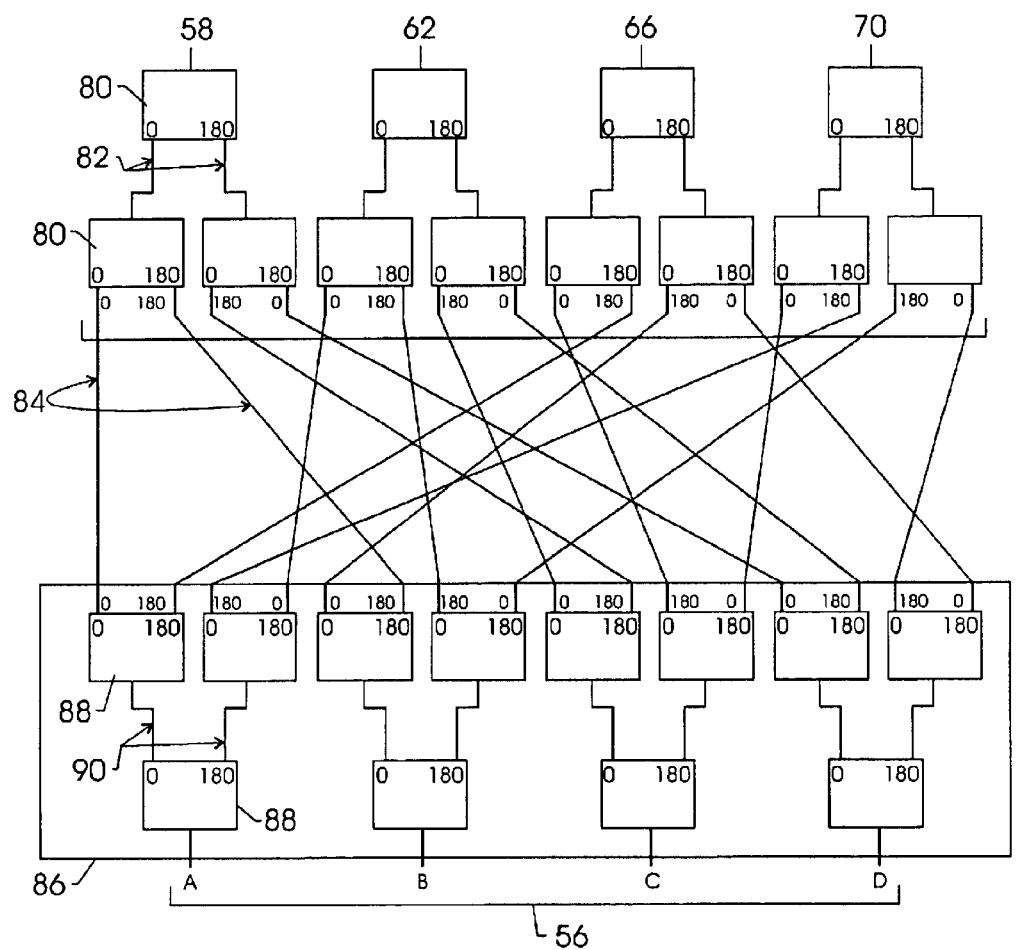
FIG. 6 is a diagrammatic view illustrating the connections in one exemplary embodiment of the signal processing circuit of FIG. 5.

The signal processing circuit 34, in one aspect as shown in FIG. 5, comprises a plurality of splitters 80 to split a plurality of magnetic resonance signals received from the plurality of coils 52. FIG. 5 illustrates the signals received from four coils 58, 62, 66 and 70. Each of the plurality of magnetic resonance signals is split into a first pair of signals 82 with 180 degrees phase shift and each of the first pair of signals 82 is further split into a second pair of signals depicted generally by the reference numeral 84, with 180 degree phase shift. The signal processing circuit 34 further comprises a combiner circuit 86 (including combiners 88) to combine the second pair of signals 84 received from the plurality of splitters 80 into combined signal 90. The combiner circuit 86 is configured to yield a selective combination of the plurality of magnetic resonance signals which correlates to an individual contiguous region 56, represented by A, B, C and D in FIG. 5. FIG. 6 illustrates the respective connections between the splitters 80 and combiners 88 in an exemplary embodiment to yield a combined signal 90 which can be correlated to the individual contiguous regions A, B, C, and D. As would be appreciated by one skilled in the art, the analog circuit may also employ 90 degree phase shifters in place of 180 degree phase shifters to achieve the desired combination of MR signals. Other additional features may also be used, for example each individual coil may be connected to its own receiver and data acquisition system in place of combiners.

The signal processing circuit 34, in another aspect is configured to convert the plurality of magnetic resonance signals detected by the plurality of coils 52 to a digital form and to perform localization computation to yield a selective combination of the plurality of magnetic resonance signals which correlates to an individual contiguous region 56. In one example the localization computation uses a Hadamard Transform.

Another aspect of the invention is a method of detecting and transmitting magnetic resonance signals. The method includes receiving and transmitting a plurality of magnetic resonance signals using a plurality of coils 52 of a phased array coil assembly 26, described hereinabove in reference to FIG. 2, FIG. 3 and FIG. 4. The method also comprises overlapping the loops 54 of the plurality of coils 52 for reducing mutual inductances between the plurality of coils 52.

An alternate aspect is a method of using a phased array coil assembly 26 in presence of a gradient field system. This method includes receiving a plurality of magnetic resonance signals using a plurality of coils 52 of the phased array coil assembly 26 described in reference with FIG. 2, FIG. 3 and FIG. 4, and processing these signals detected by the phased array coil assembly 26. The method for processing the signals comprises localizing the plurality of signals originating in at least one of contiguous regions 56 of the predetermined area 50 being imaged. Localizing, as described herein refers to correlating each of a contiguous regions 56 with a corresponding predetermined combination of a plurality of signals received from each of respective plurality of coils 52, using phase shifts of the plurality of magnetic resonance signals received from each of respective plurality of coils 52.

Processing the magnetic resonance signals, in one example comprises using analog circuitry for splitting a plurality of magnetic resonance signals received from the plurality of coils 52 into a first pair of signals 82 with 180 degrees phase shift. Each of the first pair of signals 82 is further split into a second pair of signals 84 with 180 degree phase shift. Processing the magnetic resonance signals further comprises combining the second pair of signals 84 to yield a selective combination of the plurality of magnetic resonance signals which correlates to an individual contiguous region 56.

Processing the magnetic resonance signals, in another example comprises converting the plurality of magnetic resonance signals detected by the plurality of coils 52 to a digital form and performing localization computation to yield a selective combination of the plurality of magnetic resonance signals which correlates to an individual contiguous region 56. In one example, the localization computation uses Hadamard Transform.

Another aspect of the invention is an image created using the methods described hereinabove.

While only certain features of the invention have been illustrated and described herein, many modifications and changes will occur to those skilled in the art. It is therefore to be understood that the appended claims are intended to cover all such modifications and changes as fall within the true spirit of the invention.

What is claimed is:

1. A phased array coil assembly for quadrature detection in magnetic resonance imaging comprising:
   a first phased array coil assembly comprising a plurality of coils coextensively covering a first predetermined area, wherein each of the plurality of coils comprises a different number of loops over the first predetermined area and dividing the first predetermined area into at least three contiguous regions arranged linearly along the first predetermined area; and
   a second phased array coil assembly comprising a plurality of coils coextensively covering a second predetermined area, wherein each of the plurality of coils comprises a different number of loops over the second predetermined area and dividing the second predetermined area into at least three contiguous regions arranged linearly along the second predetermined area, and
   wherein the second phased array coil assembly is disposed orthogonal to the first phased array coil assembly.

2. A phased array coil assembly of claim 1, wherein the first and second phased array coil assemblies are generally planar.

3. A phased array coil assembly of claim 1, wherein the first and second phased array coil assemblies are generally curvacious.

4. A magnetic resonance imaging system comprising:
   a magnet assembly comprising:
      a primary coil;
      a transmit coil assembly;
   a phased array coil assembly, wherein the phased array coil assembly comprises a plurality of coils coextensively covering a predetermined area, each of the plurality of coils comprising a different number of loops over the predetermined area and dividing the predetermined area into at least three contiguous regions arranged linearly along the predetermined area;
   a control and processing circuit operatively connected to the magnet assembly, comprising a signal processing circuit coupled to the phased array coil assembly for receiving a plurality of magnetic resonance signals detected by the plurality of coils, the signal processing circuit being configured to localize the plurality of magnetic resonance signals originating in at least one of the contiguous regions;
   one or more system controller circuits operatively connected to the control and processing circuit; and
   an operator interface station operatively connected to the one or more system control circuits.

5. The imaging system of claim 4, wherein at least one loop of a respective coil of the plurality of coils is configured to overlap a loop of a another respective coil of the plurality of coils to reduce mutual inductance between the plurality of coils.

6. The magnetic resonance system of claim 4, wherein the phased array coil assembly comprises at least four coils coextensively covering the predetermined area.

7. The magnetic resonance system of claim 4, wherein the phased array coil assembly comprises:
   a first coil forming a single loop extending over the predetermined area;
   a second coil coextensive with the first coil and forming two loops over the predetermined area;
   a third coil coextensive with the second coil and forming three loops over the predetermined area; and
   a fourth coil coextensive with the third coil and forming four loops over the predetermined area,
   and wherein the predetermined area is divided into four contiguous regions arranged linearly along the predetermined area.

8. The magnetic resonance system of claim 4, wherein the phased array coil assembly comprises:
   a first planar phased array coil assembly; and
   a second generally similar planar phased array coil assembly disposed orthogonal to the first planar phased array coil assembly.

9. The magnetic resonance system of 4, wherein the phased array coil assembly, further comprises a plurality of self similar assemblies disposed to enclose a volume.

10. The magnetic resonance system of claim 4, wherein each of the plurality of coils is symmetrical about a horizontal axis with respect to the axis along which the plurality of coils is arranged.

11. The magnetic resonance system of claim 4, wherein each of the plurality of coils is symmetrical about a vertical axis with respect to the axis along which the plurality of coils is arranged.

12. The magnetic resonance imaging system of claim 4, wherein the plurality of magnetic resonance signals vary in phase with position of the plurality of coils.

13. The magnetic resonance system of claim 4, wherein the signal processing circuit comprises a plurality of splitters to split a plurality of magnetic resonance signals received from the plurality of coils, wherein each of the plurality of magnetic resonance signals is split into a first pair of signals with 180 degrees phase shift and wherein each of the first pair of signals are further split into a second pair of signals with 180 degree phase shift.

14. The magnetic resonance system of claim 4, wherein the signal processing circuit further comprises a combiner circuit to combine the second pair of signals received from the plurality of splitters; wherein the combiner circuit is configured to yield a selective combination of the plurality of magnetic resonance signals which correlates to an individual contiguous region.

15. The magnetic resonance system of claim 4, wherein the signal processing circuit is configured to convert the plurality of magnetic resonance signals detected by the plurality of coils to a digital form and to perform localization computation to yield a selective combination of the plurality of magnetic resonance signals which correlates to an individual contiguous region.

16. A method of detecting magnetic resonance signals comprising:
receiving a plurality of magnetic resonance signals using a plurality of coils of a phased array coil assembly, wherein each of the plurality of coils coextensively covers a predetermined area, each of the plurality of coils comprising a different number of loops over the predetermined area and dividing the predetermined area into at least three contiguous regions arranged linearly along the predetermined area.

17. The method of claim 16, further comprising transmitting the plurality of the magnetic resonance signals through the phased array coil assembly.

18. The method of claim 16, further comprising overlapping the loops of the plurality of coils for reducing mutual inductances between the plurality of coils.

19. A method of using a phased array coil assembly in presence of a gradient field system comprising:
receiving a plurality of magnetic resonance signals using a plurality of coils of the phased array coil assembly, wherein each of the plurality of coils coextensively covers a predetermined area, each of the plurality of coils comprising a different number of loops over the predetermined area and dividing the predetermined area into at least three contiguous regions arranged linearly along the predetermined area; and
processing the magnetic resonance signals detected by the phased array coil assembly.

20. The method of claim 19, further comprising overlapping the loops of the plurality of coils for reducing mutual inductances between the plurality of coils.

21. The method of claim 19, wherein processing the magnetic resonance signals comprises localizing the plurality of magnetic resonance signals originating in at least one of contiguous regions of the predetermined area being imaged.

22. The method of claim 21, wherein localizing the plurality of magnetic resonance signals comprises:
correlating each of a contiguous regions with a corresponding predetermined combination of a plurality of magnetic resonance signals received from each of respective plurality of coils using phase shifts of the plurality of magnetic resonance signals received from each of respective plurality of coils.

23. The method of claim 22, wherein the predetermined combination of the plurality of magnetic resonance signals comprises using a combiner circuit before converting the magnetic resonance signals into a digital form.

24. The method of claim 19, wherein processing the magnetic resonance signals comprises splitting a plurality of magnetic resonance signals received from the plurality of coils into a first pair of signals with 180 degrees phase shift and wherein splitting each of the first pair of signals into a second pair of signals with 180 degree phase shift.

25. The method of claim 24, wherein processing the magnetic resonance signals further comprises combining the second pair of signals to yield a selective combination of the plurality of magnetic resonance signals which correlates to an individual contiguous region.

26. The method of claim 19, wherein processing the magnetic resonance signals further comprises converting the plurality of magnetic resonance signals detected by the plurality of coils to a digital form and performing localization computation to yield a selective combination of the plurality of magnetic resonance signals which correlates to an individual contiguous region.

27. The method of claim 26, wherein the localization computation uses Hadamard Transform.

28. An image created using the method of claim 16.

29. An image created using the method of claim 19.

30. A magnetic resonance imaging system comprising:
a phased array coil assembly including a plurality of coils, each coil coextensively covering a predetermined area, each of the plurality of coils comprising a different number of loops over the predetermined area and dividing the predetermined area into at least three contiguous regions arranged linearly along the predetermined area; and
a signal processing circuit coupled to the phased array coil assembly for receiving a plurality of magnetic resonance signals detected by the plurality of coils, the signal processing circuit being configured to localize the plurality of magnetic resonance signals originating in at least one of the contiguous regions.

31. The magnetic resonance imaging system of claim 30, wherein the plurality of coils are configured to detect magnetic resonance signals from a same spatial sensitivity volume.

32. The magnetic resonance imaging system of claim 30, wherein at least one loop of a respective coil of the plurality of coils is configured to overlap a loop of a another respective coil of the plurality of coils to reduce mutual inductance between the plurality of coils.

33. The magnetic resonance system of claim 30, wherein the phased array coil assembly comprises at least four coils coextensively covering the predetermined area.

34. The magnetic resonance system of claim 30, wherein the phased array coil assembly comprises:
a first coil forming a single loop extending over the predetermined area;
a second coil coextensive with the first coil and forming two loops over the predetermined area;
a third coil coextensive with the second coil and forming three loops over the predetermined area; and
a fourth coil coextensive with the third coil and forming four loops over the predetermined area,
and wherein the predetermined area is divided into four contiguous regions arranged linearly along the predetermined area.

35. The magnetic resonance system of claim 30, wherein the phased array coil assembly comprises:
a first planar phased array coil assembly; and
a second generally similar planar phased array coil assembly disposed orthogonal to the first planar phased array coil assembly.

36. The magnetic resonance system claim 30, wherein the phased array coil assembly, further comprises a plurality of self similar assemblies disposed to enclose a volume.

37. The magnetic resonance system of claim 30, wherein each of the plurality of coils is symmetrical about a horizontal axis with respect to the axis along which the plurality of coils is arranged.

38. The magnetic resonance system of claim 30, wherein each of the plurality of coils is symmetrical about a vertical axis with respect to the axis along which the plurality of coils is arranged.

39. The magnetic resonance imaging system of claim 30, wherein the plurality of magnetic resonance signals vary in phase with position of the plurality of coils.

40. The magnetic resonance system of claim 30, wherein the signal processing circuit comprises a plurality of splitters to split a plurality of magnetic resonance signals received from the plurality of coils, wherein each of the plurality of magnetic resonance signals is split into a first pair of signals with 180 degrees phase shift and wherein each of the first pair of signals are further split into a second pair of signals with 180 degree phase shift.

41. The magnetic resonance system of claim 40, wherein the signal processing circuit further comprises a combiner circuit to combine the second pair of signals received from the plurality of splitters; wherein the combiner circuit is configured to yield a selective combination of the plurality of magnetic resonance signals which correlates to an individual contiguous region.

42. The magnetic resonance system of claim 30, wherein the signal processing circuit is configured to convert the plurality of magnetic resonance signals detected by the plurality of coils to a digital form and to perform localization computation to yield a selective combination of the plurality of magnetic resonance signals which correlates to an individual contiguous region.

43. The magnetic resonance system of claim 42, wherein the localization computation uses a Hadamard Transform.

44. A phased array coil assembly for magnetic resonance imaging comprising:
    a plurality of coils, each coil coextensively covering a predetermined area, wherein each of the plurality of coils comprises a different number of loops over the predetermined area and dividing the predetermined area into at least three contiguous regions arranged linearly along the predetermined area.

45. The phased array coil assembly of claim 44 comprising at least four coils coextensively covering the predetermined area.

46. The phased array coil assembly of claim 44 comprising:
    a first coil forming a single loop extending over the predetermined area;
    a second coil coextensive with the first coil and forming two loops over the predetermined area;
    a third coil coextensive with the second coil and forming three loops over the predetermined area; and
    a fourth coil coextensive with the third coil and forming four loops over the predetermined area,
    and wherein the predetermined area is divided into four contiguous regions arranged linearly along the predetermined area.

47. The phased array coil assembly of claim 44 comprises:
    a first planar phased array coil assembly; and
    a second generally similar planar phased array coil assembly disposed orthogonal to the first planar phased array coil assembly.

48. The phased array coil assembly of claim 44, further comprising a plurality of self similar assemblies disposed to enclose a volume.

49. The phased array coil assembly of claim 44, wherein each of the plurality of coils is symmetrical about a horizontal axis with respect to the axis along which the plurality of coils is arranged.

50. The phased array coil assembly of claim 44, wherein each of the plurality of coils is symmetrical about a vertical axis with respect to the axis along which the plurality of coils is arranged.

51. A phased array coil assembly for magnetic resonance imaging comprising:
    a first coil forming a single loop extending over the predetermined area;
    a second coil coextensive with the first coil and forming two loops over the predetermined area;
    a third coil coextensive with the second coil and forming three loops over the predetermined area; and
    a fourth coil coextensive with the third coil and forming four loops over the predetermined area,
    and wherein the predetermined are is divided into four contiguous regions arranged linearly along the predetermined area.

52. The phased array coil assembly of claim 51, wherein the first coil (58), the second coil, the third coil and the fourth coil are symmetrical a horizontal axis with respect to the axis along which the phased array coil assembly is arranged.

53. The phased array coil assembly of claim 51, wherein the first coil, the second coil, the third coil and the fourth coil are symmetrical about a vertical axis with respect to the axis along which the phased array coil assembly is arranged.

* * * * *